United States Patent
Chung et al.

(10) Patent No.: US 7,064,435 B2
(45) Date of Patent: Jun. 20, 2006

(54) SEMICONDUCTOR PACKAGE WITH IMPROVED BALL LAND STRUCTURE

(75) Inventors: Myung-Kee Chung, Chungcheongnam-do (KR); Min-Keun Kwak, Chungcheongnam-do (KR); Kil-Soo Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/877,733

(22) Filed: Jun. 25, 2004

(65) Prior Publication Data

US 2005/0023683 A1    Feb. 3, 2005

(30) Foreign Application Priority Data

Jul. 29, 2003    (KR) ................ 10-2003-0052328

(51) Int. Cl.
    *H01L 23/48* (2006.01)
(52) U.S. Cl. ............... 257/738; 257/737; 257/780
(58) Field of Classification Search ............ 257/737, 257/738, 780
    See application file for complete search history.

(56) References Cited

U.S. PATENT DOCUMENTS

| | | | |
|---|---|---|---|
| 5,519,580 A | 5/1996 | Natarajan et al. | |
| 5,706,178 A | 1/1998 | Barrow | |
| 5,872,399 A | 2/1999 | Lee | |
| 6,125,043 A * | 9/2000 | Hauer et al. | 361/760 |
| 6,201,305 B1 * | 3/2001 | Darveaux et al. | 257/779 |
| 6,324,754 B1 | 12/2001 | DiStefano et al. | |
| 6,329,605 B1 * | 12/2001 | Beroz et al. | 174/256 |
| 6,396,707 B1 | 5/2002 | Huang et al. | |
| 6,543,128 B1 | 4/2003 | Huang et al. | |
| 2002/0070451 A1 * | 6/2002 | Burnette et al. | 257/737 |
| 2004/0113285 A1 * | 6/2004 | Tay et al. | 257/786 |
| 2005/0023679 A1 * | 2/2005 | Liu | 257/737 |

* cited by examiner

Primary Examiner—Nathan J. Flynn
Assistant Examiner—Benjamin P. Sandvik
(74) Attorney, Agent, or Firm—Marger Johnson & McCollom, P.C.

(57) ABSTRACT

A semiconductor package has ball lands each configured to have a composite structure of SMD type and NSMD type. One peripheral portion of the ball land is covered with a mask layer, thus forming the SMD type, whereas the other peripheral portion is exposed through an opening area of the mask layer, thus forming the NSMD type. In one embodiment, the first peripheral portion is disposed to face a central point of a ball-mounting surface of a substrate, and the second peripheral portion is disposed to face the opposite direction to the central point. The composite structure of the ball lands provides more stable and enhanced connections between connection balls, such as solder balls, and the ball-mounting surface.

18 Claims, 7 Drawing Sheets

SEMICONDUCTOR PACKAGE WITH IMPROVED BALL LAND STRUCTURE

CROSS REFERENCE TO RELATED APPLICATIONS

This U.S. non-provisional application claims priority under 35 U.S.C. § 119 to Korean Patent Application No. 2003-52328, filed Jul. 29, 2003, the contents of which are incorporated by reference.

BACKGROUND OF THE INVENTION

1. Field of the Invention

The present invention relates generally to electronic packaging technology and, more particularly, to semiconductor packages having improved ball land structures.

2. Description of the Related Art

A recent high-integration technology for integrated circuit (IC) makes it possible to form and connect much more circuits in and on a semiconductor chip at a given chip size. Thus, a package, which contains the semiconductor chip therein, also needs more input/output (I/O) terminals communicating with external circuitry such as a motherboard.

In order to meet such a need, a ball grid array (BGA) package has been developed wherein the I/O terminals are distributed over a package surface, rather than just located peripherally at one or more package edges as in a conventional lead frame package. Typically, an array of solder balls provides the surface-distributed I/O terminals for the BGA package. Such distribution of terminal locations radically allows a reduction in a board surface required for the BGA package when the package is mounted on the motherboard.

In the conventional BGA package, the solder balls are formed on a lower surface of a substrate, and the semiconductor chip is attached on an upper surface of the substrate. The chip is electrically connected to the substrate through wires and encapsulated with resin encapsulant. Hereinafter, the lower surface of the substrate will be referred to as a ball-mounting surface. Further, a region of the ball-mounting surface on which the solder ball is formed will be referred to as a solder ball land.

FIG. 1A schematically shows, in a plan view, one type of the solder ball land of a conventional BGA package. This type is generally known as a solder mask defined (SMD) type.

As shown in FIG. 1A, a solder ball land 10 and a wiring pattern 14 connected thereto are formed on the ball-mounting surface of the substrate (not shown). The solder ball land 10 is generally shaped like a circle and made of copper. Further, the solder ball land 10 is preferably plated with nickel and gold for enhancing a reliable attachment of a solder ball (not shown). A solder mask 16 covers the overall ball-mounting surface, together with the wiring pattern 14 and a peripheral portion 10a of the solder ball land 10, but exposes a central portion 10b of the solder ball land 10 through an opening 16a.

FIG. 1B schematically shows, in a plan view, another type of the solder ball land of a conventional BGA package. This type is generally known as a non-solder mask defined (NSMD) type.

As shown in FIG. 1B, a solder ball land 20 and a wiring pattern 24 connected thereto are formed on the ball-mounting surface 1 of the substrate. A solder mask 26 covers the ball-mounting surface 1 and a main portion 24a of the wiring pattern 24, but exposes an end portion 24b of the wiring pattern 24, the entire solder ball land 20, and parts of the ball-mounting surface 1 around the solder ball land 20, through an opening 26a.

As widely known in the art, the above-described conventional solder ball lands 10 and 20 have the following drawbacks.

In the case of SMD type, during a solder joint reliability test that evaluates a joining strength of the solder ball after the BGA package is mounted on the motherboard, the solder ball is often cracked or detached from the solder ball land. Further, in the case of NSMD type, after the BGA package is mounted on the motherboard, the wiring pattern is disconnected from the solder ball land, or the solder ball land is peeled from the ball-mounting surface of the substrate.

These issues related to the solder ball lands often arise in another types of packages, using solder ball connections, such as wafer-level packages, flip-chip packages, and so on.

BRIEF SUMMARY OF THE INVENTION

It is therefore an object of the present invention to provide semiconductor packages having improved ball land structures, especially, to allow stabilized and enhanced connections between solder balls and a substrate.

In one embodiment of the present invention, a semiconductor package comprises a substrate having a planar surface, a plurality of ball lands formed on the planar surface of the substrate, a mask layer covering the planar surface of the substrate and defining a plurality of opening areas through which the ball lands are substantially exposed, and a plurality of connection balls formed on the ball lands, respectively.

Particularly, a first straight line is defined to link a land center of the ball land to a central point of the planar surface, and a second straight line is defined to start from the land center and extend in the opposite direction to the first straight line. The first straight line intersects a land edge of the ball land at a first point and an opening edge of the opening area at a second point, and the second straight line intersects the land edge at a third point and the opening edge of the opening area at a fourth point. When a distance between the first point and the land center, a distance between the second point and the land center, a distance between the third point and the land center, and a distance between the fourth point and the land center are defined as a first, a second, a third, and a fourth distances, respectively, the first distance is longer than the second distance, and the third distance is shorter than the fourth distance.

In another embodiment of the prevent invention, the ball land has a first radius. Further, a first opening edge of the opening area has a second radius greater than the first radius, and a second opening edge of the opening area has a third radius smaller than the first radius.

Also, a first angle formed by the first opening edge may range from 60 degrees to 180 degrees on the second straight line as a central axis, and a second angle formed by the second opening edge may range from 180 degrees to 300 degrees on the first straight line as a central axis. Preferably, the first angle is about 150 degrees.

In still another embodiment of the present invention, the opening area has a fourth radius. Further, a first land edge of the ball land has a fifth radius smaller than the fourth radius, and a second land edge of the ball land has a sixth radius greater than the fourth radius. A third angle formed by the first land edge may range from 60 degrees to 180 degrees on the second straight line as a central axis, and a fourth angle formed by the second land edge may range from 180 degrees to 300 degrees on the first straight line as a central axis. Preferably, the third angle is about 150 degrees.

In still another embodiment of the present invention, a semiconductor package comprises a substrate having a planar surface, a plurality of ball lands formed on the planar surface of the substrate, each ball land having a seventh radius, a mask layer covering the planar surface of the substrate and defining a plurality of opening areas through which the ball lands are substantially exposed, each opening area having an eighth radius smaller than the seventh radius, and a plurality of connection balls formed on the ball lands, respectively.

Particularly, the ball land further has a curved groove and a plurality of straight grooves. A centerline of the curved groove has a ninth radius smaller than the eighth radius, and the straight grooves are radially arranged along an outer periphery of the curved groove and communicate with the curved groove. Also, each straight groove extends to a position between a land edge of the ball land and an opening edge of the opening area.

In still another embodiment of the present invention, a fifth angle formed by the curved groove may range from 60 degrees to 180 degrees on a third straight line as a central axis, the third straight line linking a central point of the planar surface to a land center of the ball land. Preferably, the fifth angle is about 150 degrees.

In still another embodiment of the present invention, a semiconductor device comprises a substrate including a planar surface having a central point, at least one terminal land formed on the planar surface of the substrate, the terminal land having a first peripheral portion and a second peripheral portion, a mask layer covering the planar surface of the substrate and defining at least one opening area through which the terminal land is substantially exposed, and at least one connection terminal formed on the terminal land. In particular, the first peripheral portion of the terminal land is covered with the mask layer, and the second peripheral portion is exposed through the opening area of the mask layer.

In still another embodiment of the present invention, the first peripheral portion is disposed to face the central point of the planar surface of the substrate, and the second peripheral portion is disposed to face the opposite direction to the central point. Moreover, the connection terminal may include a solder ball, and the substrate may include a printed circuit board, a silicon substrate, and a flexible circuit tape.

The invention will become more readily apparent from the following Detailed Description, which proceeds with reference to the drawings, in which:

DETAILED DESCRIPTION OF THE PREFERRED EMBODIMENT(S)

Figure 1A:
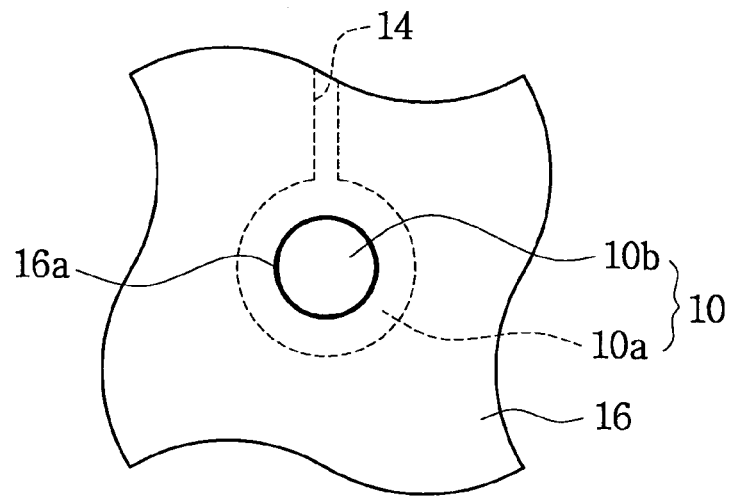
FIG. 1A is a plan view showing an SMD type of a solder ball land of a conventional BGA package.
Figure 1B:
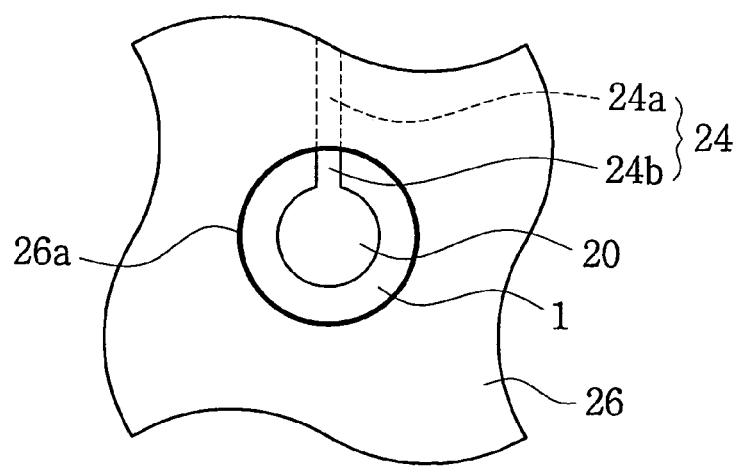
FIG. 1B is a plan view showing an NSMD type of a solder ball land of a conventional BGA package.

The present invention will now be described more fully hereinafter with reference to the accompanying drawings, in which several preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the description, well-known structures and processes have not been shown in detail to avoid obscuring the present invention. It will be appreciated that for simplicity and clarity of illustration, some elements illustrated in the figures have not necessarily been drawn to scale. Like reference numerals and characters are used for like and corresponding parts of the various drawings.

First Embodiment

Figure 2A:
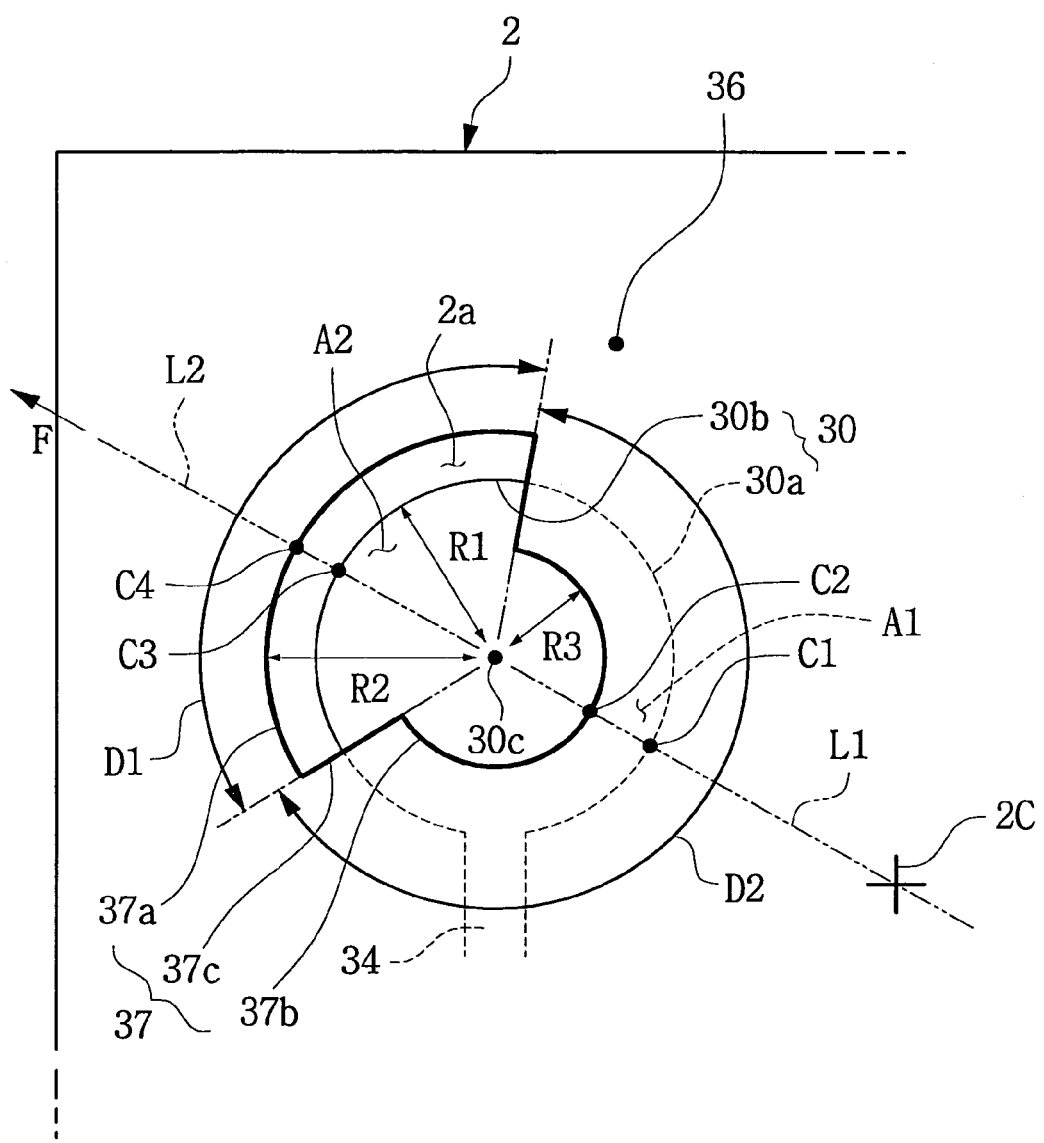
FIGS. 2A and 2B are plan views showing a solder ball land of a BGA package in accordance with one embodiment of the present invention.
Figure 2B:
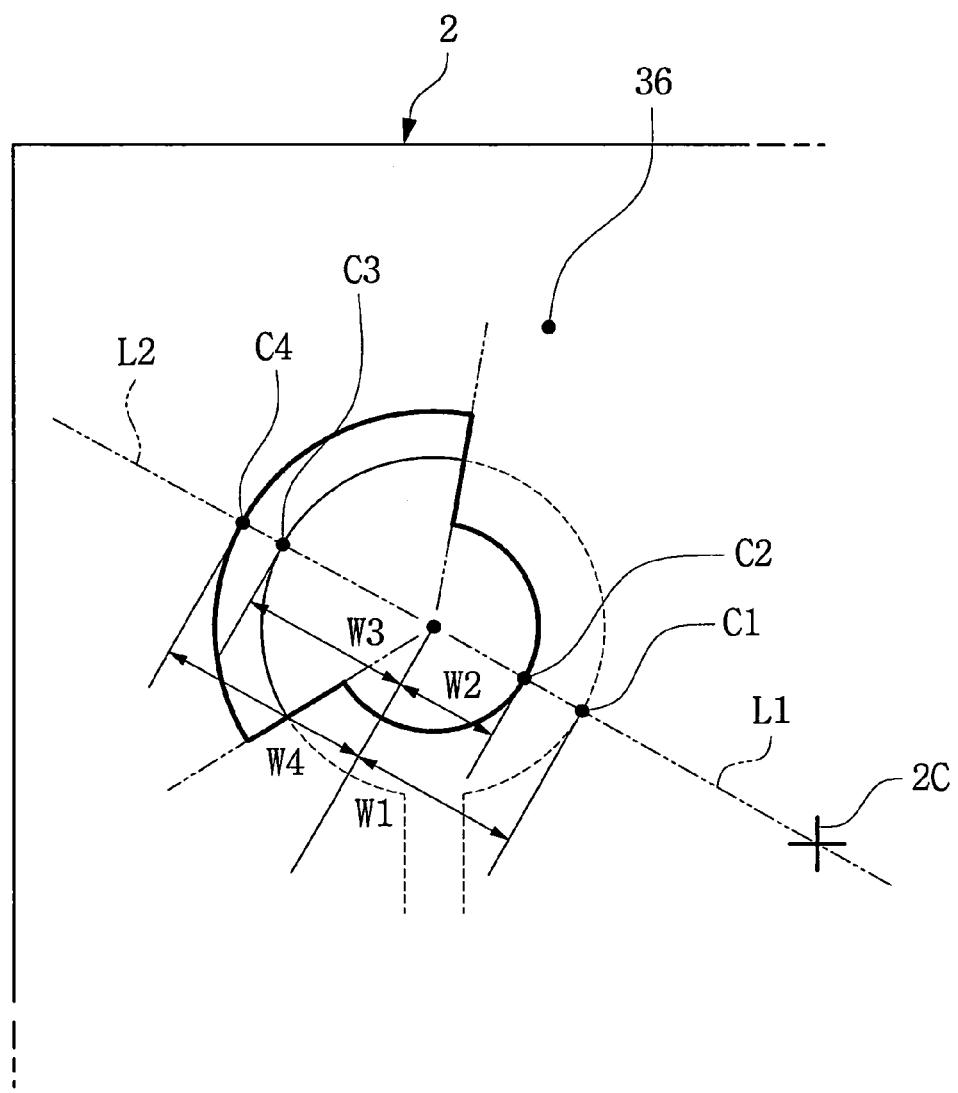

FIGS. 2A and 2B show, in plan views, a solder ball land of a BGA package in accordance with one embodiment of the present invention. Referring to FIGS. 2A and 2B, a solder ball land 30 is formed on a ball-mounting surface 2 of a substrate used for a BGA package (not shown). A solder mask 36 covers the ball-mounting surface 2, defining an opening area 37.

A first straight line L1 starts from a land center 30c of the solder ball land 30 and extends toward a central point 2C of the ball-mounting surface 2. The first straight line L1 intersects a land edge 30a of the solder ball land 30 at a first point C1. A distance between the first point C1 and the land center 30c is defined as a first distance W1. Further, the first straight line L1 intersects a second opening edge 37b of the opening area 37 at a second point C2. A distance between the second point C2 and the land center 30c is defined as a second distance W2. As best shown in FIG. 2B, the first distance W1 is longer than the second distance W2, and as best shown in FIG. 2A, the solder mask 36 covers one part of a peripheral portion of the solder ball land 30. This covered part is defined as a first peripheral portion A1.

A second straight line L2 starts from the land center 30c and extends in the opposite direction to the first straight line L1. The second straight line L2 intersects a land edge 30b at a third point C3. A distance between the third point C3 and the land center 30c is defined as a third distance W3. Further, the second straight line L2 intersects a first opening edge 37a of the opening area 37 at a fourth point C4. A distance between the fourth point C4 and the land center 30c is defined as a fourth distance W4. As best shown in FIG. 2B, the third distance W3 is shorter than the fourth distance W4, and as best shown in FIG. 2A, the solder mask 36 does not cover the other part of the peripheral portion of the solder ball land 30. This non-covered, i.e., exposed, part is defined as a second peripheral portion A2.

To summarize, in the solder ball land 30, the first peripheral portion A1 facing the central point 2C of the ball-mounting surface 2 is covered with the solder mask 36, whereas the second peripheral portion A2 facing the opposite direction is exposed through the opening area 37.

Additionally, the ball-mounting surface 2 adjacent to the second peripheral portion A2 is partially exposed through the opening area 37, as indicated by a reference number '2a' in FIG. 2A. Consequently, the first peripheral portion A1 forms an SMD type solder ball land structure, and the second peripheral portion A2 forms an NSMD type solder ball land structure.

This composite structure of the solder ball land 30 produces favorable effects such as the followings. In the past, after the BGA package is mounted on the motherboard by using the solder ball, the solder ball land and the solder ball undergo mechanical stress due to a mismatch in the coefficient of thermal expansion (CTE) between the package and the motherboard. Here, mechanical stress chiefly acts in a radially outward direction, which is indicated by a reference character 'F' in FIG. 2A, opposite to the central point 2C. This causes crack or detachment of the solder ball in case of the SMD type, and disconnection of a wiring pattern or peeling of the solder ball land in case of the NSMD type, as discussed above.

By the way, it has been found that the problem of the SMD type occurs mainly at the second peripheral portion A2 and the problem of the NSMD type occurs mainly at the first peripheral portion A1. Therefore, by configuring the solder ball land 30 to have the invented composite structure, such problems can be solved at once. This unique configuration of the ball lands can also be available to another types of packages, for example, a wafer-level package, a flip-chip package, and other surface-mount packages. Furthermore, the substrate on which the solder ball lands are formed is a printed circuit board (PCB), a silicon substrate, a flexible circuit tape, and so on. The solder ball land 30 is electrically connected to the wiring pattern 34. Preferably, the solder ball land 30 is shaped like a circular plate having a first radius R1. The opening area 37 has the first opening edge 37a and the second opening edge 37b as described above. Preferably, the first and second opening edges 37a and 37b are shaped like an arc, and the center of the opening area 37 coincides with the land center 30c. The first opening edge 37a has a second radius R2 greater than the first radius R1, and the second opening edge 37b has a third radius R3 smaller than the first radius R1. The first and second opening edges 37a and 37b are connected by a third opening edge 37c. Preferably, the third opening edge 37c forms a straight line.

A first angle D1, which is formed by the first opening edge 37a, can range from 60 degrees to 180 degrees on the second straight line L2 as a central axis. A second angle D2, which is formed by the second opening edge 37b, can range from 180 degrees to 300 degrees on the first straight line L1 as a central axis. Preferably, the first and second angles D1 and D2 are about 150 degrees and about 210 degrees, respectively.

Second Embodiment

Figure 3:
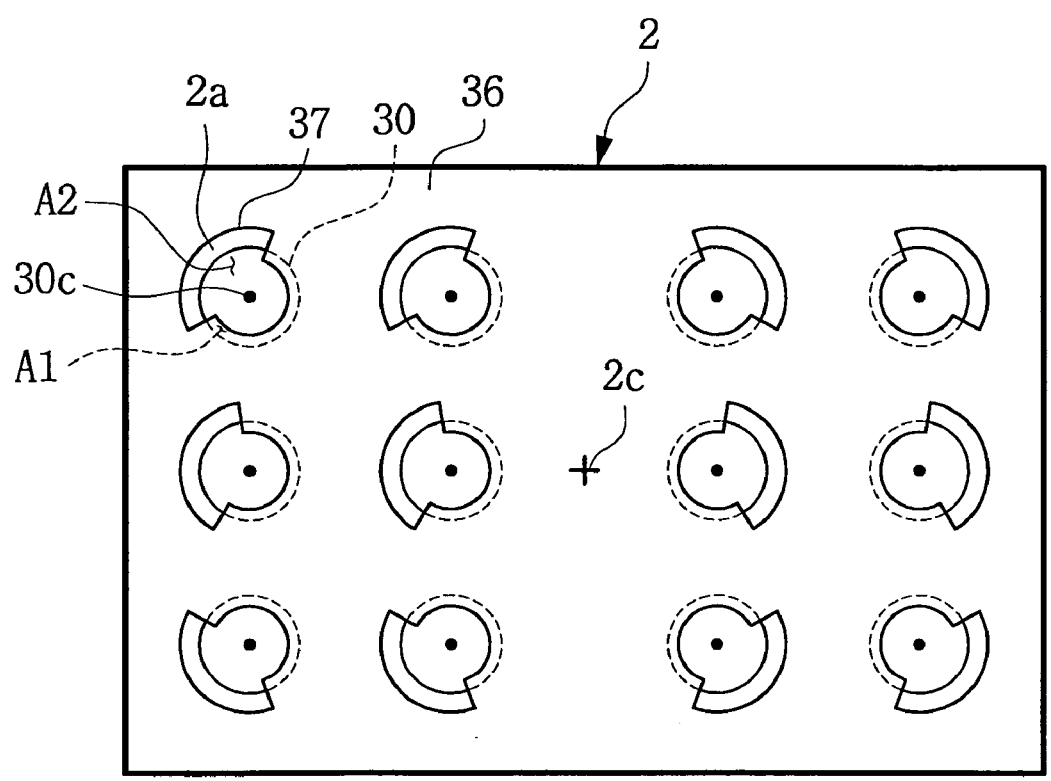
FIG. 3 is a plan view showing a ball-mounting surface of a BGA package in accordance with another embodiment of the present invention.

FIG. 3 shows, in a plan view, a ball-mounting surface of a BGA package in accordance with another embodiment of the present invention.

As shown in FIG. 3, the ball-mounting surface 2 of the BGA package is almost covered with the solder mask 36, except a plurality of opening areas 37. Further, a plurality of solder ball lands 30 are formed on the ball-mounting surface 2, and each solder ball land 30 is partially exposed through the respective one opening area 37.

In each of the solder ball lands 30, the first peripheral portion A1 forming the SMD type structure is disposed to face the central point 2C of the ball-mounting surface 2, whereas the second peripheral portion A2 forming the NSMD type structure is disposed to face the opposite direction to the central point 2C. This composite structure provides more stable and enhanced connection between the solder ball (not shown) and the ball-mounting surface 2, even though the ball-mounting surface 2 is warped due to the aforementioned mismatch in the CTE.

Third Embodiment

Figure 4:
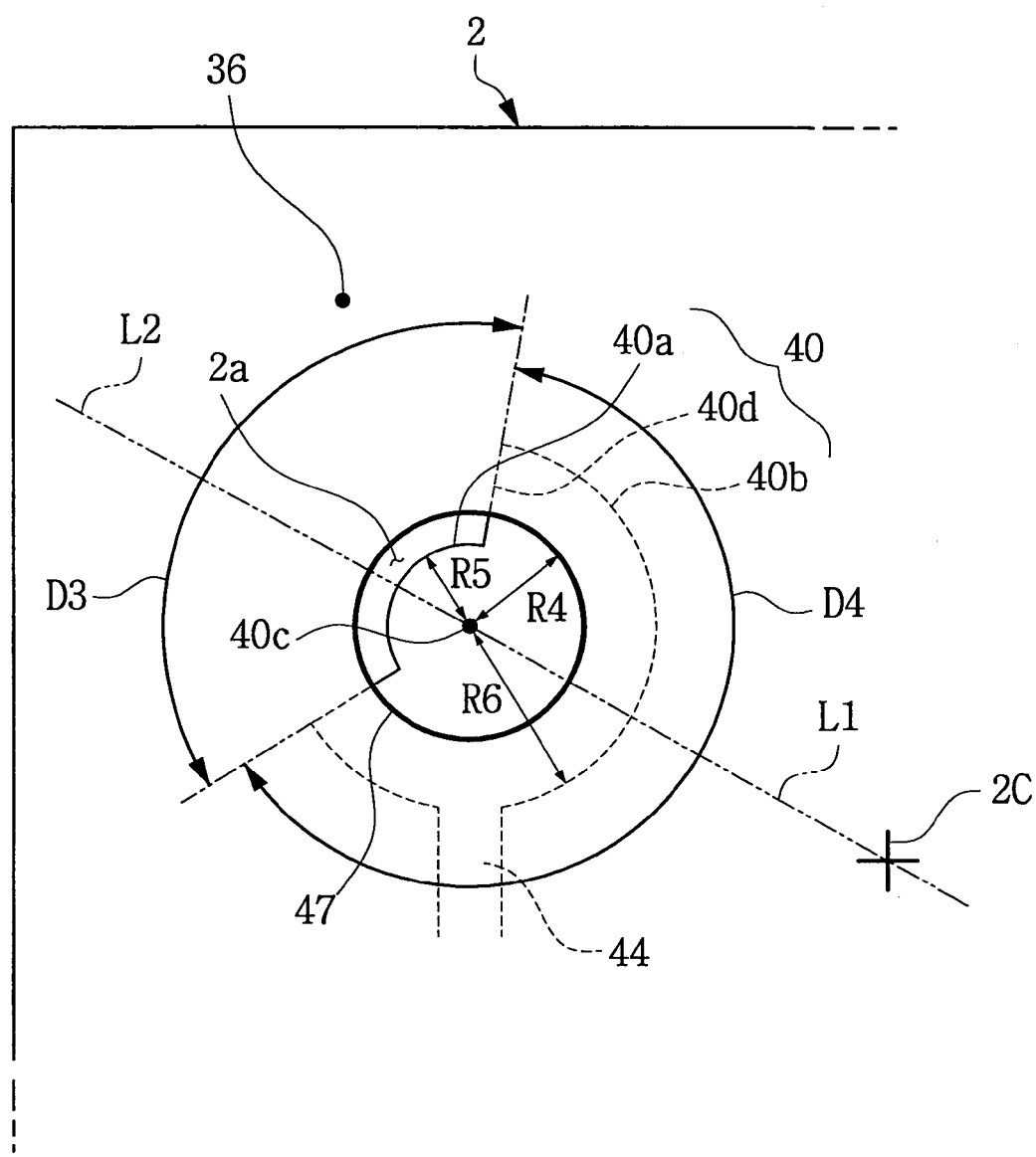
FIG. 4 is a plan view showing a solder ball land of a BGA package in accordance with still another embodiment of the present invention.

FIG. 4 shows, in a plan view, a solder ball land of a BGA package in accordance with still another embodiment of the present invention.

As shown in FIG. 4, a solder ball land 40 and a wiring pattern 44 electrically connected thereto are formed on the ball-mounting surface 2. Further, the solder mask 36 covers the ball-mounting surface 2, defining an opening area 47. The solder ball land 40 has a first land edge 40a and a second land edge 40b, which are preferably shaped like an arc. The opening area 47 is shaped like a circle having a fourth radius R4. Preferably, a land center 40c coincides with a center of the opening area 47. In the solder ball land 40, the first land edge 40a has a fifth radius R5 smaller than the fourth radius R4, and the second land edge 40b has a sixth radius R6 greater than the fourth radius R4. The first and second land edges 40a and 40b are connected by a straight land edge 40d.

A third angle D3, which is formed by the first land edge 40a, can range from 60 degrees to 180 degrees on the second straight line L2 as a central axis. A fourth angle D4, which is formed by the second land edge 40b, can range from 180 degrees to 300 degrees on the first straight line L1 as a central axis. Preferably, the third and fourth angles D3 and D4 are about 150 degrees and about 210 degrees, respectively.

Fourth Embodiment

Figure 5:
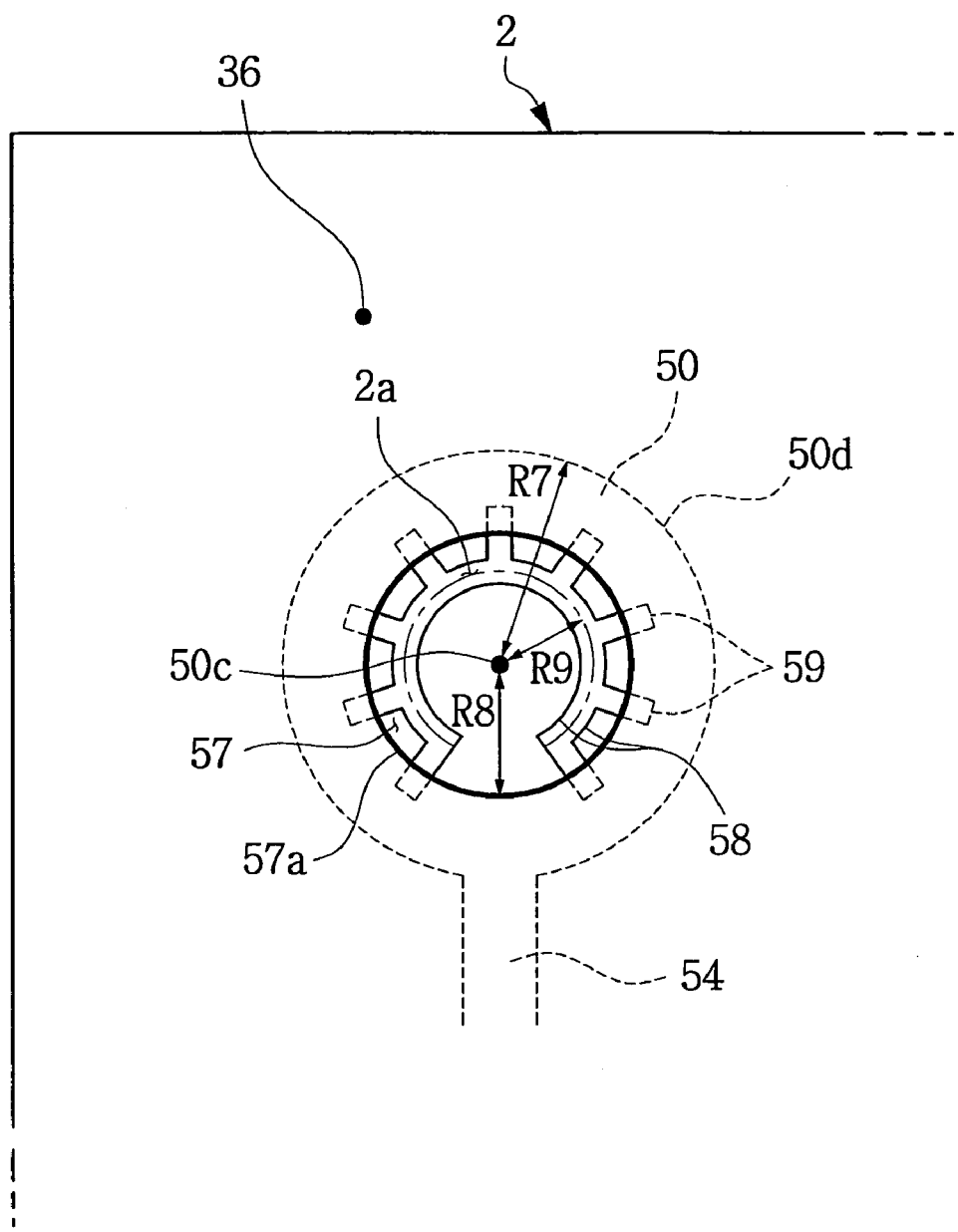
FIG. 5 is a plan view showing a solder ball land of a BGA package in accordance with still another embodiment of the present invention.

FIG. 5 shows, in a plan view, a solder ball land of a BGA package in accordance with still another embodiment of the present invention.

As shown in FIG. 5, a solder ball land 50 and a wiring pattern 54 electrically connected thereto are formed on the ball-mounting surface 2. Further, the solder mask 36 covers the ball-mounting surface 2, defining an opening area 57. The solder ball land 50 is shaped like a circular plate having a seventh radius R7. The opening area 57 is shaped like a circle having an eighth radius R8 smaller than the seventh radius R7. Preferably, a land center 50c coincides with a center of the opening area 57.

The solder ball land 50 has a curved groove 58 and a plurality of straight grooves 59. A centerline of the curved groove 58 has a ninth radius R9 smaller than the eighth radius R8 so that the curved groove 58 is positioned within the opening area 57. The straight grooves 59 are radially arranged along an outer periphery of the curved groove 58, while communicating with the curved groove 58. Each straight groove 59 extends to a position between a land edge 50d of the solder ball land 50 and an opening edge 57a of the opening area 57. This configuration of the straight grooves 59 permits the exhaust of voids generated when the solder ball (not shown) is formed on the solder ball land 50. Therefore, trapping of the voids, which may cause degradation in solder ball formation, is effectively prevented.

Fifth Embodiment

Figure 6:
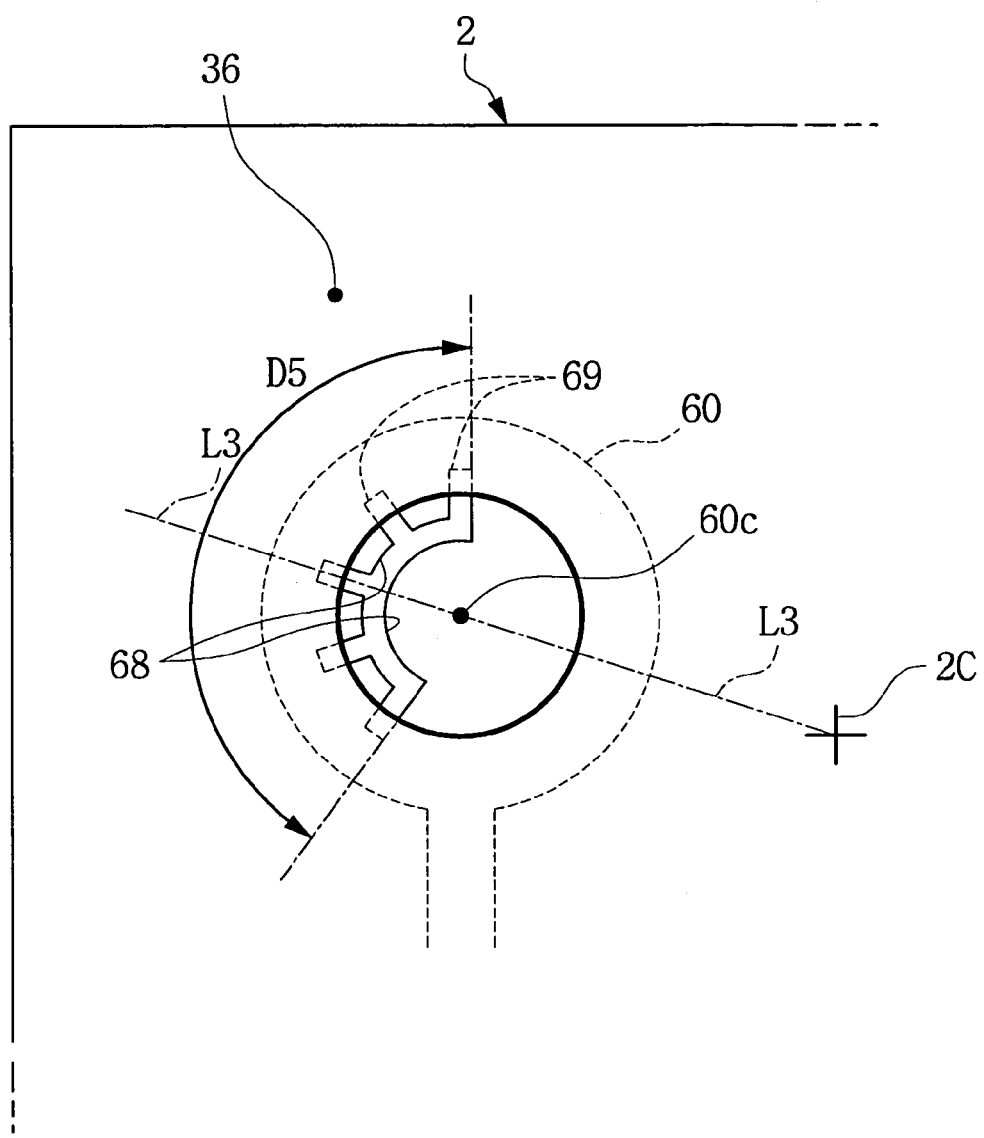
FIG. 6 is a plan view showing a solder ball land of a BGA package in accordance with still another embodiment of the present invention.

FIG. 6 shows, in a plan view, a solder ball land of a BGA package in accordance with still another embodiment of the present invention.

As shown in FIG. 6, the solder ball land 60 has a curved groove 68 and a plurality of straight grooves 69, as discussed above. A fifth angle D5, which is formed by the curved groove 68, can range from 60 degrees to 180 degrees on a third straight line L3 as a central axis. The third straight line L3 links the central point 2C of the ball-mounting surface 2 to a land center 60c of the solder ball land 60. Preferably, the fifth angle D5 is about 150 degrees. Like the fourth embodiment, the curved groove 68 is positioned within the opening area. Also, the straight grooves 69 are radially arranged along an outer periphery of the curved groove 68, while communicating with the curved groove 68 and extending in the opposite direction to the central point 2C.

A person skilled in the art will be able to practice the present invention in view of the description present in this document, which is to be taken as a whole. Numerous details have been set forth in order to provide a more thorough understanding of the invention. In other instances, well-known features have not been described in detail in order not to obscure unnecessarily the invention.

While the invention has been disclosed in its preferred form, the specific embodiments thereof as disclosed and illustrated herein are not to be considered in a limiting sense. Indeed, it should be readily apparent to those skilled in the art in view of the present description that the invention can be modified in numerous ways. The inventor regards the subject matter of the invention to include all combinations and subcombinations of the various elements, features, functions and/or properties disclosed herein.

What is claimed is:

1. A semiconductor package, comprising:
   a substrate having a planar surface;
   a plurality of ball lands formed on the planar surface of the substrate, each ball land having a ball land radius;
   a mask layer covering the planar surface of the substrate and defining a plurality of mask opening areas through which the ball lands are substantially exposed, each mask opening area having a mask opening area radius smaller than the ball land radius, each ball land including:
   a curved opening, and
   a plurality of straight openings radially arranged along an outer periphery of the curved opening, extending to a position between a land edge of the ball land and a mask opening edge of the mask opening area, and communicating with the curved opening; and
   a plurality of connection balls formed on the plurality of ball lands;
   wherein a centerline of the curved opening has a curved opening radius smaller than the mask opening area radius.

2. The semiconductor package of claim 1 wherein the curved opening forms a fifth angle in the range of about 60 degrees to about 180 degrees on a third straight line as a central axis, the third straight line linking a central point of the planar surface to a land center of the ball land.

3. The semiconductor package of claim 2 wherein the fifth angle is about 150 degrees.

4. The semiconductor device of claim 1 wherein the substrate comprises a printed circuit board, a silicon substrate, or a flexible circuit tape.

5. A semiconductor device, comprising:
   a substrate including a planar surface having a central point;
   at least one terminal land formed on the planar surface of the substrate, the terminal land having a first peripheral portion and a second peripheral portion;
   at least one connection terminal formed on the terminal land; and
   a mask layer covering the planar surface of the substrate and defining at least one opening area through which the terminal land is substantially exposed, one of the at least one opening area having:
   a first opening edge substantially following a first arc having a first radius; and
   a second opening edge substantially following a second arc having a second radius;
   wherein the mask layer overlies the first peripheral portion of the terminal land, and the second peripheral portion is exposed through the opening area of the mask layer, the second peripheral portion having a third edge substantially following a third arc having a third radius, the third radius being less than the first radius and greater than the second radius.

6. The semiconductor device of claim 5 wherein:
   the first peripheral portion is disposed facing the central point of the planar surface of the substrate; and
   the second peripheral portion is disposed facing the opposite direction to the central point.

7. The semiconductor device of claim 5 wherein the connection terminal includes a solder ball.

8. The semiconductor device of claim 5 wherein the substrate comprises a printed circuit board, a silicon substrate, or a flexible circuit tape.

9. A semiconductor package comprising:
   a substrate having a planar surface;
   a plurality of ball lands formed on the planar surface of the substrate;
   a mask layer covering the planar surface of the substrate and defining a plurality of opening areas through which the ball lands are substantially exposed;
   a plurality of connection balls formed on the ball lands, respectively;
   a first straight line defined to pass through a land center of the ball land to a central point of the planar surface, said first straight line intersecting a land edge of the ball land at a first point and an opening edge of the opening area at a second point; and
   a second straight line defined to start from the land center and extend in the opposite direction to the first straight line, said second straight line intersecting the land edge at a third point and the opening edge of the opening area at a fourth point; and
   wherein a distance between the first point and the land center defines a first distance, a distance between the second point and the land center defines a second distance, and the first distance is greater than the second distance, and
   wherein a distance between the third point and the land center defines a third distance, a distance between the fourth point and the land center defines a fourth distances, and the third distance is less than the fourth distance.

10. The semiconductor package of claim 9 wherein:
    each ball land of the plurality of ball lands has a first radius;
    a first opening edge of the opening area has a second radius greater than the first radius; and
    a second opening edge of the opening area has a third radius less than the first radius.

11. The semiconductor package of claim 10, further comprising:
    a pair of third opening edges substantially radially oriented, said pair of second opening edges forming a first angle in the range of about 60 degrees to about 180 degrees and spanning the second straight line as a central axis, and said pair of second opening edges forming a second angle in the range of about 180 degrees to about 300 degrees and spanning the first straight line as a central axis.

12. The semiconductor package of claim 11 wherein the first angle is about 150 degrees.

13. The semiconductor package of claim 11 wherein:
the opening area has a fourth radius;
a first land edge of the ball land has a fifth radius smaller than the fourth radius; and
a second land edge of the ball land has a sixth radius greater than the fourth radius.

14. The semiconductor package of claim 13 wherein the first land edge defines an arc in the range of about 60 degrees to about 180 degrees and spanning the second straight line as a central axis.

15. The semiconductor package of claim 14 wherein the arc is about 150 degrees.

16. The semiconductor device of claim 11 wherein the substrate comprises a printed circuit board, a silicon substrate, or a flexible circuit tape.

17. A semiconductor package, comprising:
a substrate having a surface;
a mask layer covering the surface having at least one opening area; and
at least one ball land formed on the surface, each ball land including:
a first edge substantially following a first arc having a first radius;
a second edge substantially following a second arc having a second radius; and one of the at least one opening area substantially exposing the ball land, the one of the at least one opening area having a third edge substantially following a third arc having a third radius, the third radius being less than the first radius and greater than the second radius.

18. The semiconductor package of claim 17 wherein:
the first arc is disposed substantially facing a center point of the substrate; and
the second arc is disposed facing a direction substantially opposite to a direction the first arc is facing.

* * * * *